United States Patent
Kato et al.

[11] Patent Number: 5,954,875
[45] Date of Patent: Sep. 21, 1999

[54] APPARATUS FOR PULLING SILICON SINGLE CRYSTAL

[75] Inventors: Koji Kato; Masayuki Sato; Takashi Takagi, all of Ohgaki, Japan

[73] Assignee: Ibiden Co., Ltd., Ongaki, Japan

[21] Appl. No.: 08/862,400

[22] Filed: May 23, 1997

[30] Foreign Application Priority Data

May 31, 1996 [JP] Japan .................................. 8-138801

[51] Int. Cl.⁶ .................................................. C30B 35/00
[52] U.S. Cl. ............................ 117/217; 117/218; 117/222
[58] Field of Search .................................. 117/213, 217, 117/218, 228

[56] References Cited

U.S. PATENT DOCUMENTS

| | | | |
|---|---|---|---|
| 5,363,796 | 11/1994 | Kobayashi et al. | 117/217 |
| 5,476,679 | 12/1995 | Lewis et al. | 427/122 |
| 5,575,847 | 11/1996 | Karamochi et al. | 117/217 |
| 5,578,123 | 11/1996 | Vilzmann et al. | 117/222 |
| 5,707,447 | 1/1998 | Schulmann et al. | 117/222 |

FOREIGN PATENT DOCUMENTS

| | | |
|---|---|---|
| 0 529 594 | 3/1993 | European Pat. Off. . |
| 0 591 525 | 4/1994 | European Pat. Off. . |
| 37 43 951 | 7/1988 | Germany . |
| 40 07 053 | 9/1990 | Germany . |
| B2-57-15079 | 3/1982 | Japan . |
| 2-229785 | 9/1990 | Japan . |
| 4-160090 | 6/1992 | Japan . |
| 5-270971 | 10/1993 | Japan . |
| 7-223895 | 8/1995 | Japan . |
| 2 218 789 | 11/1989 | United Kingdom . |

*Primary Examiner*—Felisa Hiteshew
*Attorney, Agent, or Firm*—Oliff & Berridge, PLC

[57] ABSTRACT

An apparatus for pulling silicon single crystal comprises a main apparatus body, a crucible disposed therein and comprised of a quartz crucible part and a crucible protection part, a heating member disposed at the outside of the crucible therearound, a temperature keeping cylindrical body disposed at the outside of the heating member, and a heat insulating material disposed between the temperature keeping cylindrical body and the main apparatus body, in which at least an inside upper region of the temperature keeping cylindrical body and/or the crucible protection part made from a carbonaceous material is covered with a thermally decomposed carbon film.

5 Claims, 6 Drawing Sheets

FIG_2

FIG_3

FIG_4

FIG_6
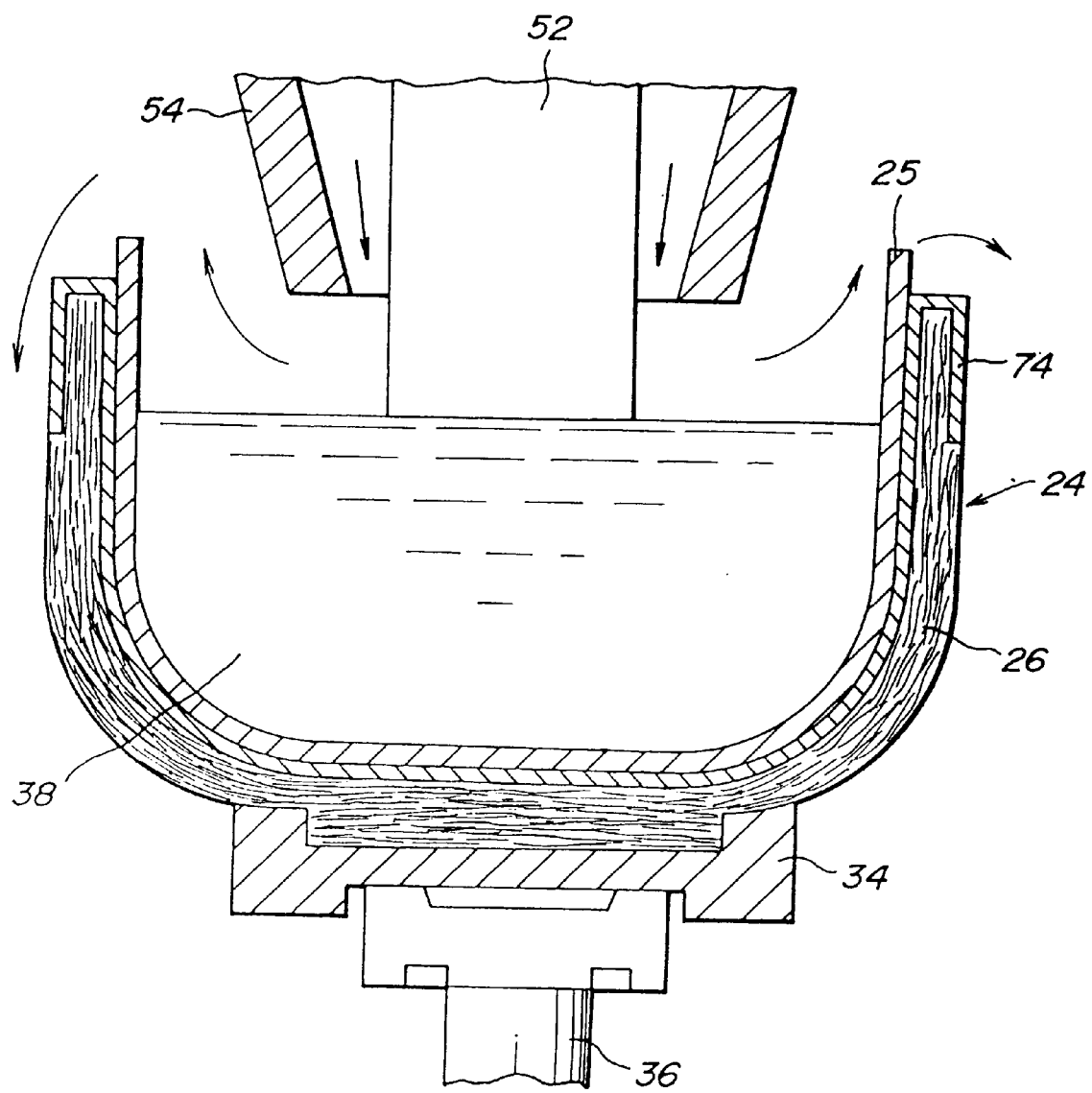

APPARATUS FOR PULLING SILICON SINGLE CRYSTAL

BACKGROUND OF THE INVENTION

1. Field of the Invention

This invention relates to an apparatus for pulling silicon single crystal, and more particularly to an improvement of a temperature keeping cylindrical body and/or a crucible for use in the silicon single crystal pulling apparatus.

2. Description of Related Art

The conventional apparatus for pulling silicon single crystal has a structure based on so-called Czochralski method, in which silicon single crystal is pulled from silicon melt in a crucible in the presence of an atmosphere gas, and is known as a single crystal production apparatus as disclosed, for example, in JP-B-57-15079. In this apparatus, as shown in FIG. 1, a rotating shaft 2 is inserted into a furnace vessel 1 from a bottom thereof and a crucible 4 is placed on a support base 3 disposed on an end face of the rotating shaft 2, while a heating member 5 and a temperature keeping cylindrical body 6 are arranged around the crucible 4 to provide a silicon melt 7 in the crucible 4. On the other hand, a rotating shaft 9 is arranged above the furnace vessel 1 so as to slide in the furnace vessel in up and down directions. A seed crystal 8 of silicon is attached to a free end of the rotating shaft 9 and moved upward from a state of contacting with the melt 7 in the crucible 4 by the upward sliding of the rotating shaft 9 during the rotation of the shaft to provide a single crystal 10 of silicon on a bottom face of the seed crystal 8 at a state of being integrally united with the seed crystal 8.

In the growth of the single crystal, it is required to eliminate an unnecessary reaction product gas from the inside of the furnace vessel for preventing the reaction of the gas with the single crystal 10 and a liquid face of the melt 7. Therefore, an inert gas 11 such as argon or the like is used as an atmosphere gas and is fed from an inert gas source (not shown) through a pipe system 12, 13 and 14 to an upper portion of the furnace vessel 1 and then discharged together with a reaction product gas 15 from the bottom of the furnace vessel 1 through a pipe 16 to the outside of the vessel. Moreover, a heat insulating material (not shown) is arranged between the temperature keeping cylindrical body 6 and the furnace vessel 1.

In this type of the silicon single crystal pulling apparatus, the temperature keeping cylindrical body, crucible and the like are required to have an excellent heat resistance and hardly react with various metals, so that they are made from a carbonaceous material such as graphite or carbon-bonded carbon fiber composite (hereinafter referred to as C/C composite simply). Particularly, a portion of the crucible directly contacting with the silicon melt is made from quartz for preventing the inclusion of an impurity such as metal or the like into the silicon melt, while the remaining portion of the crucible is made from graphite or C/C composite having an excellent heat resistance as a crucible protection part for preventing the softening deformation of the quartz crucible part because the crucible is heated above 1400° C. for the formation of silicon melt.

In the conventional apparatus, the silicon melt is formed by heating and melting a silicon material in the crucible by means of the heating member, so that $SiO_2$ constituting the quartz crucible part and Si melted in the crucible are vaporized and dispersed in the apparatus. Further, the temperature keeping cylindrical body and the crucible, particularly upper regions thereof are exposed to a higher temperature above 1400° C. required for the formation of the silicon melt and SiO gas produced from the quartz crucible part and silicon melt, so that the temperature of these upper regions becomes higher than the other remaining regions.

Therefore, it is considered that the following chemical reaction is caused in the upper regions of the temperature keeping cylindrical body and the crucible by carbon existing in these regions and SiO gas dispersed from the quartz crucible part and silicon melt:

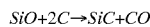

$$SiO+2C \rightarrow SiC+CO$$

As a result of such a chemical reaction, the carbonaceous material constituting the temperature keeping cylindrical body or the crucible protection part is rendered into a silicon carbide on the surface of the upper region. The resulting silicon carbide is different from the carbonaceous material in the properties, so that when the apparatus is cooled after the stop of operation, the presence of the silicon carbide creates cracks in the cylindrical body or the crucible protection part to bring about the deterioration of the durability. If the cracks are created in these parts, pieces of the silicon carbide and the carbonaceous material are peeled off from these parts to contaminate the inside of the apparatus. These pieces result in the crystal defect of the resulting silicon single crystal to be pulled with a higher purity, so that the formation of silicon carbide should be controlled surely.

Moreover, when Si vapor dispersed in the apparatus contacts with the lower region of the temperature keeping cylindrical body of a relatively lower temperature, it is cooled and liquefied to adhere (deposit) onto the surface of the lower region in form of droplets, which penetrates into a gap between the temperature keeping cylindrical body and the support base. As a result, the liquefied Si serves as an adhesive between the cylindrical body and the support base and hence the exchange of the temperature keeping cylindrical body is impossible.

SUMMARY OF THE INVENTION

It is, therefore, an object of the invention to provide an apparatus for pulling silicon single crystal provided with a temperature keeping cylindrical body and a crucible having a long durable life without the formation of silicon carbide by reaction between carbonaceous material and SiO gas and the deposition of Si vapor.

The inventors have made various studies in order to solve the aforementioned problems of the conventional technique while utilizing the merits of the carbonaceous material used in the temperature keeping cylindrical body and/or the crucible and found that better results are obtained by absorbing and adsorbing Si vapor on the carbonaceous material and as a result the invention has been accomplished.

According to the invention, there is the provision of an apparatus for pulling silicon single crystal comprising a main apparatus body, a crucible disposed therein and comprised of a quartz crucible part and a crucible protection part, a heating member disposed at the outside of the crucible therearound, a temperature keeping cylindrical body disposed at the outside of the heating member, and a heat insulating material disposed between the temperature keeping cylindrical body and the main apparatus body, characterized in that at least an inside upper region of the temperature keeping cylindrical body and/or the crucible protection part made from a carbonaceous material is covered with a thermally decomposed carbon film.

In a preferable embodiment of the invention, the carbonaceous material is a graphite substrate having an average thermal expansion coefficient of 3.5 to $6.0 \times 10^{-6}/°$ C. within a range of from room temperature to 1000° C. and an average pore size of not less than 10000 angstrom within a pore size range of 75 to 75000 angstrom as measured by mercury penetration method.

In another preferable embodiment of the invention, the carbonaceous material is a carbon-bonded carbon fiber composite (C/C composite).

In the other preferable embodiment of the invention, the thermally decomposed carbon film is extended on an outside upper region and the full inside region of the temperature keeping cylindrical body and/or the crucible protection part at a thickness of 10–100 μm.

BRIEF DESCRIPTION OF THE DRAWINGS

The invention will be described with reference to the accompanying drawings, wherein:

FIG. 6 is a partly enlarged diagrammatic section view of an embodiment of a crucible comprised of a quartz crucible part and a crucible protection part covered with a thermally decomposed carbon film in the apparatus of FIG. 2.

DESCRIPTION OF PREFERRED EMBODIMENTS

Figure 1:
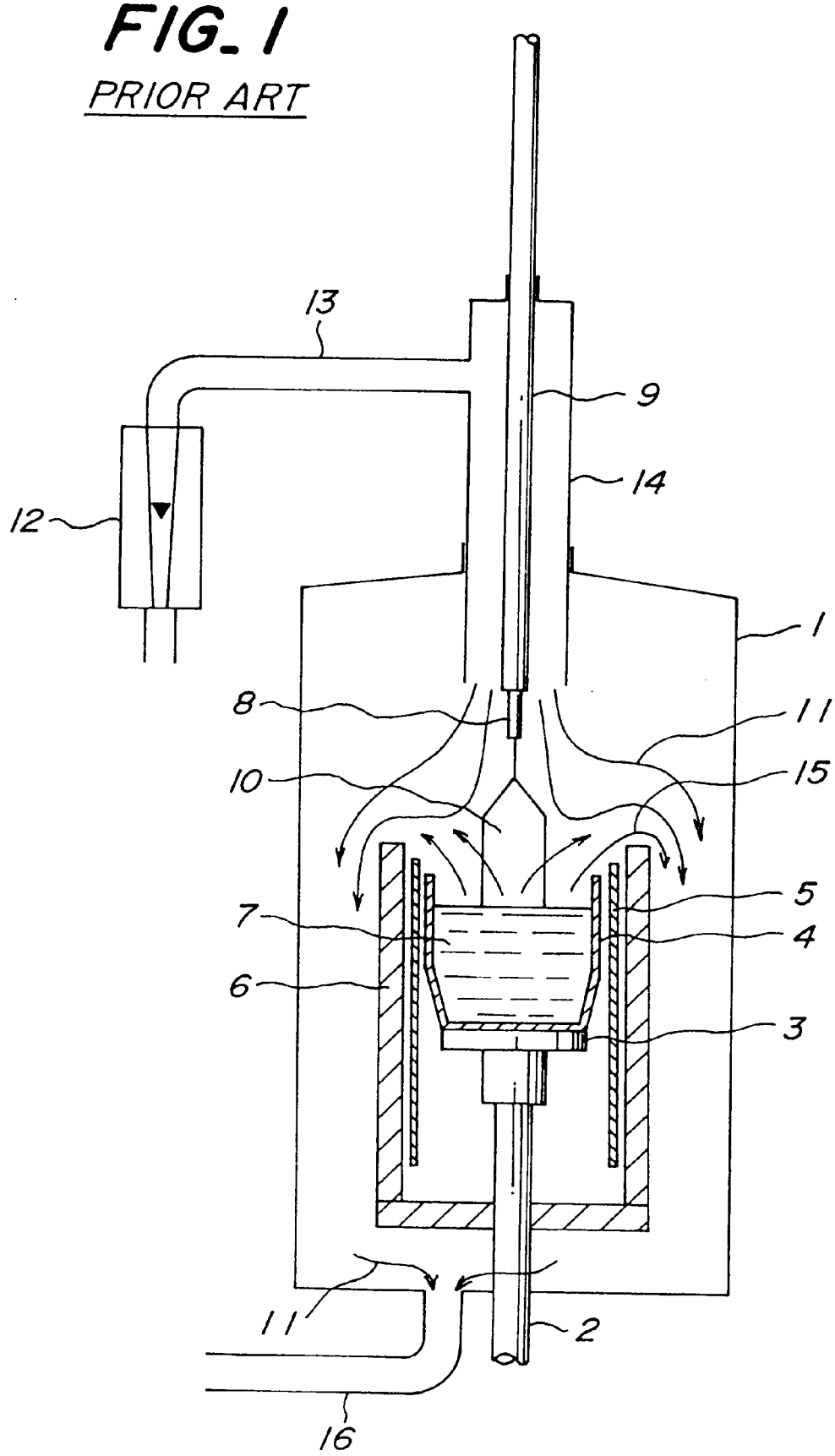
FIG. 1 is a diagrammatic section view of the conventional apparatus for pulling silicon single crystal.
Figure 2:
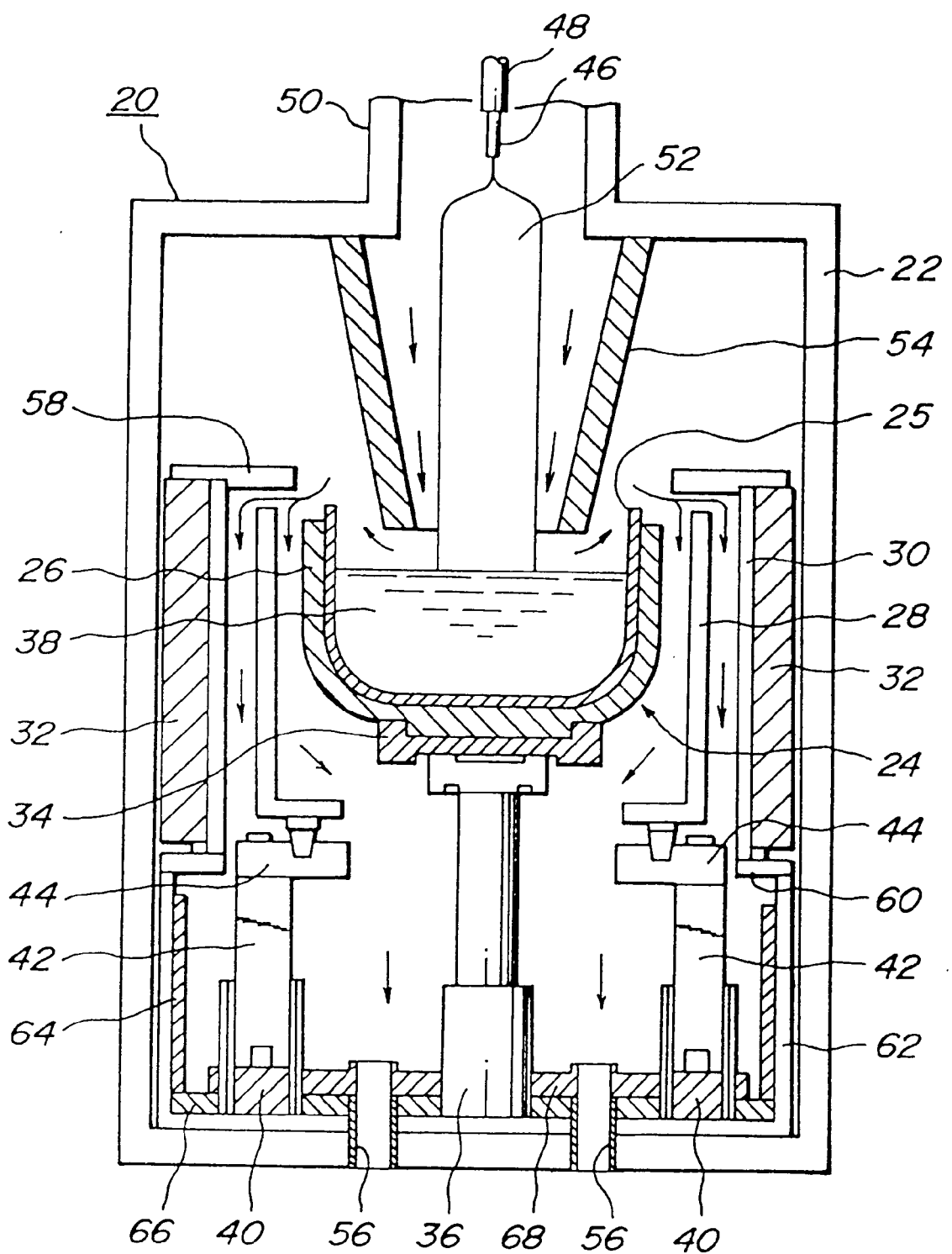
FIG. 2 is a diagrammatic section view of an embodiment of the apparatus for pulling silicon single crystal according to the invention.

As shown in FIG. 2, an apparatus 20 for pulling silicon single crystal according to the invention comprises a main apparatus body 22, a crucible 24 comprised of a quartz crucible part 25 and a crucible protection part 26, a heating member 28, a temperature keeping cylindrical body 30, and a heat insulating material 32.

The crucible 24 is rotatably supported by a support base 34 fixed on a top end of a rotating shaft 36 and contains a melt 38 of a silicon material therein. As mentioned above, the crucible 24 has a double structure comprised of the quartz crucible part 25 directly contacting with the silicon melt 38 and the crucible protection part 26 protecting the quartz crucible part and made from a carbonaceous material having an excellent heat resistance.

As the heating member 28, there is generally used so-called cylindrical carbon heater or the like. The heating member 28 is supported by a terminal plate 44 placed on an upper end face of an electrically conductive shaft 42, which is connected to an electrode 40 disposed on the bottom of the main apparatus body 22, and power may be supplied from an external source (not shown) through these members 40, 42, 44 to the heating member 28. The silicon material included in the quartz crucible part 24 is heated above 1400° C. by the heating member 28 to form the silicon melt 38, during which a seed crystal 46 of silicon attached to an free end face of a rotating shaft 48 is passed downward through an inlet port 50 for an inert gas disposed on the upper portion of the main apparatus body 22 and contacted with an upper surface of the silicon melt 38 and thereafter the rotating shaft 48 is gradually pulled upward while rotating the rotating shafts 36 and 48 in opposite directions to form a single crystal 52 of silicon on a free end face of the seed crystal 46. In this case, the silicon melt 38 in the crucible 24 should be maintained at the molten state by heating the crucible 24 to a sufficiently high temperature by means of the heating member 28 though the surface level of the silicon melt 38 is gradually lowered with the growth of the silicon single crystal 52.

Further, an inert gas is fed from the inlet port 50 through a gas flow adjusting member 54 into the inside of the main apparatus body 22 and then discharged from outlet ports 56 formed in the bottom of the main apparatus body 22. In order to form a passage for the inert gas between the upper end of the heating member 28 and the temperature keeping cylindrical body 30 as shown in FIG. 2, the temperature keeping cylindrical body 30 and the heat insulating material 32 are disposed between an upper ring 58 and a lower ring 60, while the lower ring 60 is supported by a support member 62. Particularly, a zone ranging from the position of the lower ring 60 toward the bottom of the main apparatus body 22 at the inside thereof is also exposed to a higher temperature required for maintaining the silicon melt 38 at the molten state, so that another heat insulating materials 64, 66 are arranged in this zone. Furthermore, a bottom receiving member 68 is arranged on the heat insulating material 66 disposed on the bottom of the main apparatus body 22.

Figure 3:
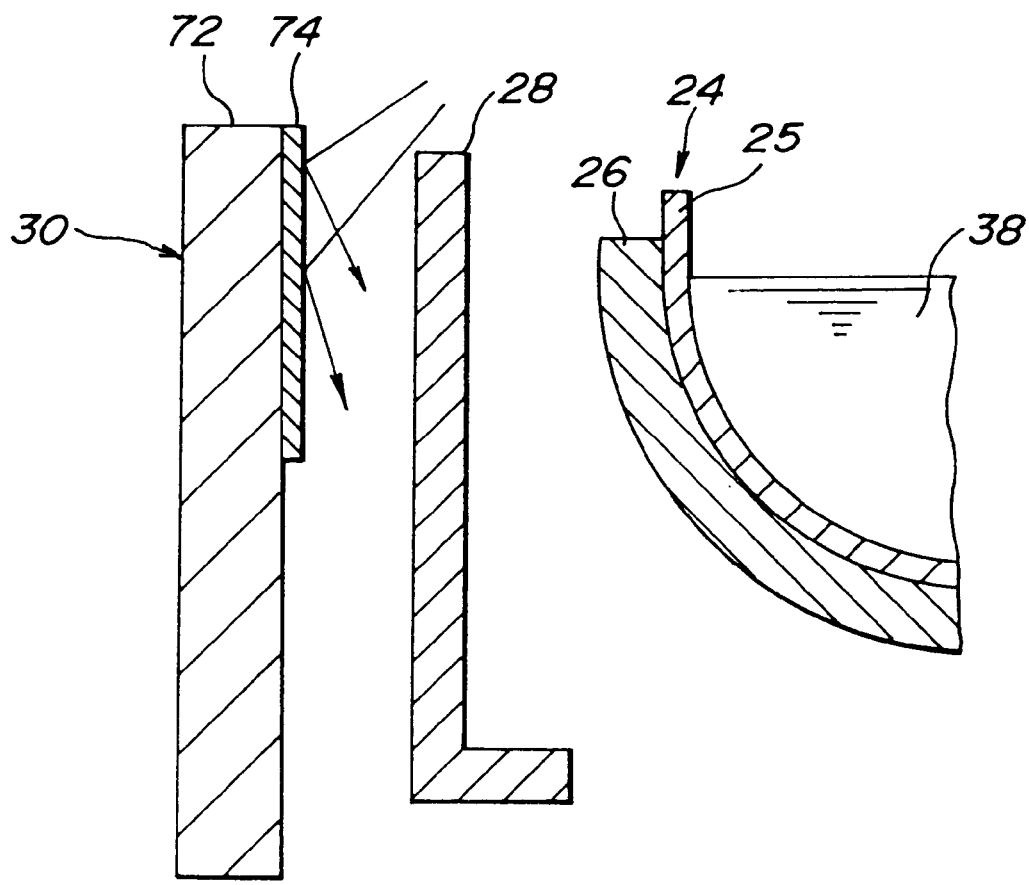
FIG. 3 is a partly enlarged diagrammatic section view of a first embodiment illustrating an arrangement of a temperature keeping cylindrical body covered with a thermally decomposed carbon film, a heating member and a crucible in the apparatus of FIG. 2.

A first embodiment of the temperature keeping cylindrical body 30 according to the invention is comprised of a graphite substrate 72 and a thermally decomposed carbon film 74 formed on at least an inside upper region of the graphite substrate 72 facing the heating member 28 as shown in FIG. 3. The graphite substrate 72 and the thermally decomposed carbon film 74 are prepared as mentioned in the following examples. Particularly, the graphite substrate 72 has an average thermal expansion coefficient of 3.5 to $6.0 \times 10^{-6}/°$ C. within a range of from room temperature to 1000° C. and an average pore size of not less than 10000 angstrom within a pore size range of 75 to 75000 angstrom as measured by mercury penetration method.

Figure 4:
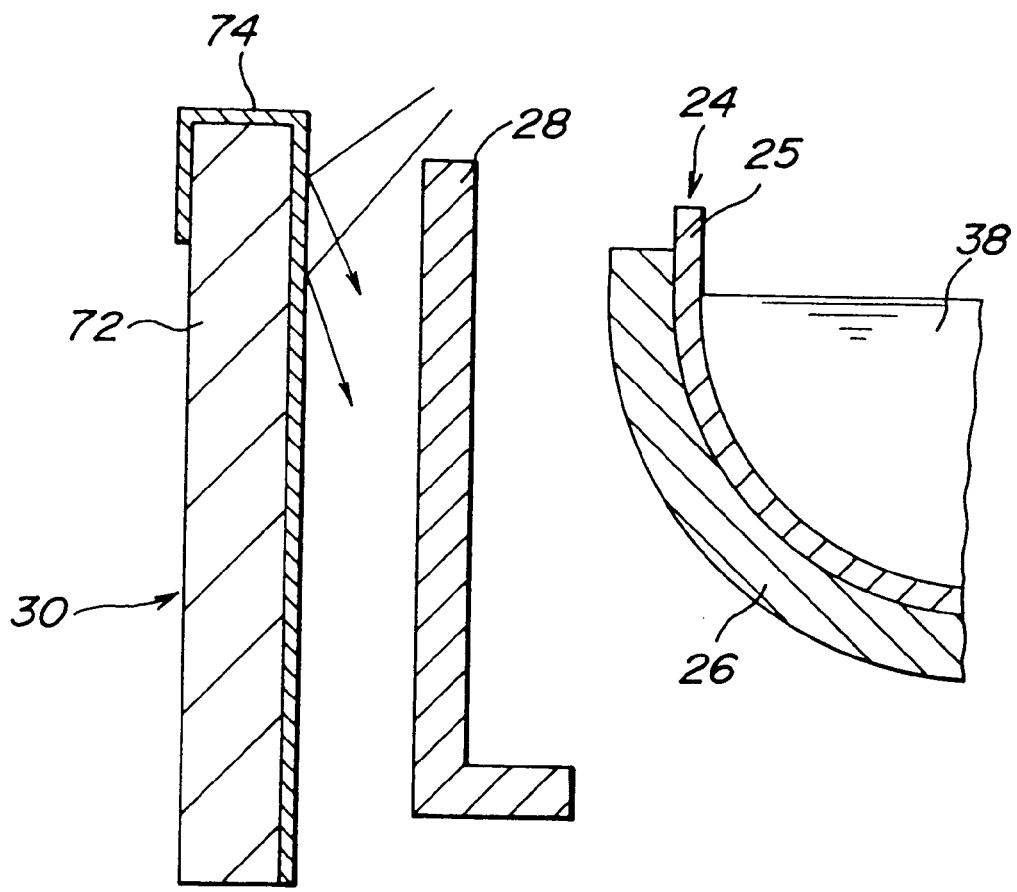
FIG. 4 is a partly enlarged diagrammatic section view of a second embodiment illustrating an arrangement of a temperature keeping cylindrical body covered with a thermally decomposed carbon film, a heating member and a crucible in the apparatus of FIG. 2.

In a second embodiment of the temperature keeping cylindrical body 30 according to the invention, a thermally decomposed carbon film 74 is extended on an outside upper region and a full inside region of the same graphite substrate 72 as in the first embodiment as shown in FIG. 4. In this case, an area of the graphite substrate 72 not covered with the thermally decomposed carbon film 74 is about 20% of the full surface area of the graphite substrate. Moreover, the exposed area of the graphite substrate is preferably within a range of 5–95% of the full surface area of the graphite substrate. If the exposed area exceeds 95%, the action of the thermally decomposed carbon film preventing the reaction between Si vapor and the carbonaceous material can not sufficiently be developed, while if it is less than 5%, gas included in the carbonaceous material can not sufficiently be discharged therefrom in a given time and hence there may be caused the peeling of the thermally decomposed carbon film from the carbonaceous material due to the expansion of the remaining gas during the heating.

Figure 5:
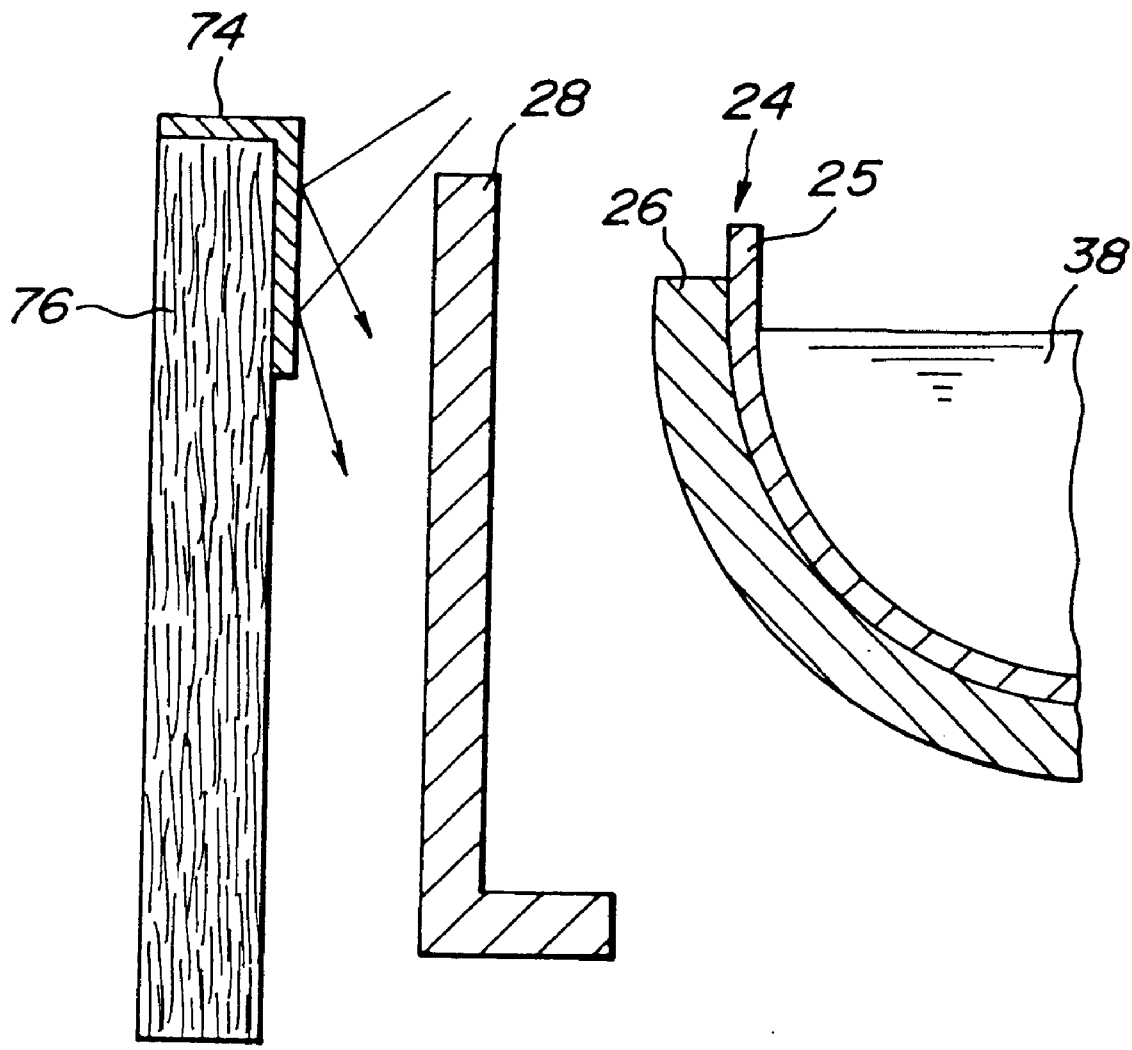
FIG. 5 is a partly enlarged diagrammatic section view of a third embodiment illustrating an arrangement of a temperature keeping cylindrical body covered with a thermally decomposed carbon film, a heating member and a crucible in the apparatus of FIG. 2.

A third embodiment of the temperature keeping cylindrical body 30 according to the invention is comprised of a carbon-bonded carbon fiber composite (C/C composite) 76 and a thermally decomposed carbon film 74 formed on at least an inside upper region of the C/C composite facing the heating member 28 as shown in FIG. 5. The C/C composite is light in the weight, high in the strength and excellent in the resistance to heat shock. The C/C composite 76 is prepared by orienting carbon fibers in a uniaxial direction or multi-axial directions to form a cylindrical body, impregnating with a resin, and then carbonizing it. As the resin to be impregnated, use may be made of phenolic resin, furan resin, tar pitch and the like. Moreover, the properties of the C/C composite can be improved by increasing the number of impregnation operations. If necessary, the thermally decomposed carbon film 74 may be extended on an outside upper region and the full inside region of the C/C composite 76 likewise the above second embodiment.

In the invention, the crucible protection part 26 constituting the crucible 24 is made from the graphite substrate or the C/C composite and covered on at least an inside upper region thereof with a thermally decomposed carbon film 74. As shown in FIG. 6, it is favorable that the crucible protection part 26 is made from the C/C composite and is covered with the thermally decomposed carbon film 74 over a full inside region and an outside upper region of the C/C composite. In the latter case, the inner surface of the crucible protection part 26 is smoothened to prevent the fusing of the outer surface of the quartz crucible part 25 to the inner surface of the protection crucible part 26, whereby the separation of both the parts can easily be conducted.

In any case, the thermally decomposed carbon film 74 is formed by chemical vapor deposition (CVD) method at a thickness of 10–100 $\mu$m and has a gas permeability of $10^{-10}$ to $10^{-12}$ cm$^2$/sec. That is, this carbon film is considerably impermeable and dense as compared with the graphite material. When the thickness is less than 10 $\mu$m, the film is eroded in a relatively short time, while when it exceeds 100 $\mu$m, the film is apt to be peeled from the carbonaceous material (or cause interlaminar peeling).

In the single crystal pulling apparatus having the above structure according to the invention, the crucible 24 is always heated by the heating member 28 so as to maintain the silicon melt 38 during the growth of the silicon single crystal 52 and at the same time, the temperature keeping cylindrical body 30 located near to the heating member 28 is heated to a higher temperature. During the heating, SiO gas is generated from the quartz crucible part 25 constituting the crucible 24 and Si vapor is generated from the silicon melt 38 itself housed in the crucible 24, which are scattered around the upper regions of the crucible 24 and the temperature keeping cylindrical body 30 together with the inert gas fed through the inlet port 50 as shown by arrows in FIGS. 2–6.

According to the invention, at least an inside upper region of the graphite substrate 72 or the C/C composite 76 constituting the temperature keeping cylindrical body 30 is covered with the thermally decomposed dense carbon film 74 as shown in FIGS. 3 and 5, or the full inside region and outside upper region of the graphite substrate 72 constituting the temperature keeping cylindrical body 30 and the crucible protection part 26 constituting the crucible 24 are covered with the thermally decomposed dense carbon film 74 as shown in FIGS. 4 and 6, so that the contact of the scattered SiO gas and Si vapor with the carbonaceous substrate (72, 76, 26) is prevented by the thermally decomposed carbon film 74 and hence they do not react with carbon in the carbonaceous substrate. Particularly, at least inside upper region of the temperature keeping cylindrical body and/or the crucible heated to a temperature causing the reaction between carbon in the carbonaceous substrate and SiO gas is covered with the thermally decomposed carbon film, so that there is caused no formation of silicon carbide on the temperature keeping cylindrical body or crucible by reacting SiO gas with carbon in the carbonaceous substrate.

On the other hand, Si vapor hardly deposit on the inside upper regions of the temperature keeping cylindrical body 30 and the crucible 24 because these regions are maintained at sufficiently higher temperature. As a result, Si vapor flows toward the exposed region of the carbonaceous material not covered with the thermally decomposed carbon film and is adsorbed in pores of the carbonaceous material. Therefore, Si vapor never deposits on the surface of the temperature keeping cylindrical body 30 and the crucible protection part 26 in form of droplets, so that there is caused no cracking in the carbonaceous material constituting the temperature keeping cylindrical body 30 and the crucible protection part 26 nor adhesion between the carbonaceous material and the support base thereof through the Si droplets.

The reason why at least an inside upper region of the carbonaceous material constituting the temperature keeping cylindrical body or the crucible protection part is covered with the thermally decomposed carbon film is due to the fact that it is possible to prevent the formation of silicon carbide by the reaction between the carbonaceous material located in this inside upper region and SiO gas or Si vapor because the above inside upper region first and directly contacts with the SiO gas or Si vapor.

Moreover, members directly exposing to SiO gas and Si vapor may also be covered with thermally decomposed carbon films among the members constituting the silicon single crystal pulling apparatus according to the invention if such members cause the problems such as formation of silicon carbide and the like as mentioned above.

The following examples are given in illustration of the invention and are not intended as limitations thereof.

EXAMPLE 1

A carbonaceous material is prepared by kneading 70 parts by weight of pulverized aggregate coke having an average particle size of 20 $\mu$m and 30 parts by weight of coal tar pitch as a binder under heating and then pulverizing the kneaded mass to 30–200 $\mu$m.

A graphite material is prepared by shaping the above carbonaceous material into a desired form through rubber press method and firing and graphitizing the shaped body. The resulting graphite substrate has an average pore size of 12000 angstrom as measured by mercury penetration method, an aspect ratio in thermal expansion coefficient of 1.05 and an average thermal expansion coefficient of $4.8 \times 10^{-6}$/° C.

Then, the shaped body of the graphite material is worked into a cylindrical graphite substrate having an inner diameter of 630 mm, an outer diameter of 650 mm and a height of 700 mm.

The cylindrical graphite substrate is placed in a CVD furnace and heated at 1400° C. while continuously feeding methane gas together with hydrogen gas as a carrier to the inside of the furnace, whereby a thermally decomposed carbon film having a thickness of 50 $\mu$m is formed on the full surface of the cylindrical graphite substrate. Thereafter, the thermally decomposed carbon film is removed by a sand paper so as to leave the film on only a region shown in FIG.

3, whereby there is obtained a temperature keeping cylindrical body 30 comprised of the cylindrical graphite substrate 72 and the thermally decomposed carbon film 74 as shown in FIG. 3.

Moreover, the formation of the thermally decomposed carbon film 74 may be carried out by applying a shielding material for preventing the formation of the thermally decomposed carbon film to a region of the cylindrical graphite substrate not forming the carbon film and removing it from the substrate after the formation of the carbon film.

EXAMPLE 2

A carbonaceous material is prepared by kneading 70 parts by weight of pulverized aggregate coke having an average particle size of 20 μm and 30 parts by weight of coal tar pitch as a binder under heating and then pulverizing the kneaded mass to 300–500 μm.

A graphite material is prepared by using the above carbonaceous material in the same manner as in Example 1. The resulting graphite substrate has an average pore size of 20,000 angstrom as measured by mercury penetration method, an aspect ration in thermal expansion coefficient of 1.25 and an average thermal expansion coefficient of $4.1 \times 10^{-6}/°C$.

The thus obtained graphite material is worked into a given shape in the same manner as in Example 1, and then the thermally decomposed carbon film is formed thereon in the same manner as in Example 1 to obtain a temperature keeping cylindrical body 30 as shown in FIG. 3.

EXAMPLE 3

The same procedure as in Example 1 is repeated by using the same graphite material as in Example 1 to form a temperature keeping cylindrical body 30 as shown in FIG. 4.

EXAMPLE 4

The same procedure as in Example 1 is repeated by using the same graphite material as in Example 2 to form a temperature keeping cylindrical body 30 as shown in FIG. 4.

EXAMPLE 5

A felt of carbon fibers is wound around a cylindrical body having a diameter of about 645 mm several times to form a cylindrical carbon fiber body, which is impregnated with a phenol resin and graphitized in an inert gas atmosphere after the curing of the resin. By repeating such resin impregnation and graphitization several times is obtained a cylindrical body of C/C composite having an outer diameter of 650 mm, a thickness of 5 mm and a height of 700 mm.

The same procedure as in Example 1 is repeated by using the C/C composite cylindrical body to form a temperature keeping cylindrical body 30 as shown in FIG. 5.

EXAMPLE 6

The same cylindrical body of C/C composite as in Example 5 is prepared by impregnating a woven carbon fiber cloth with a phenol resin, curing, firing at 900° C. and then repeating these procedures two times.

The same procedure as in Example 1 is repeated by using such a C/C composite cylindrical body to form a temperature keeping cylindrical body 30 as shown in FIG. 5.

COMPARATIVE EXAMPLE 1

The same graphite material as in Example 1 is worked into a temperature keeping graphite cylindrical body without the formation of the thermally decomposed carbon film.

COMPARATIVE EXAMPLE 2

A carbonaceous material is prepared by kneading 70 parts by weight of pulverized aggregate coke having an average particle size of 20 μm and 30 parts by weight of coal tar pitch as a binder under heating and then pulverizing the kneaded mass to 30–150 μm.

A graphite material is prepared by shaping the above carbonaceous material into a desired form through rubber press method and firing and graphitizing the shaped body. The resulting graphite substrate has an average pore size of 9000 angstrom as measured by mercury penetration method, an aspect ratio in thermal expansion coefficient of 1.10 and an average thermal expansion coefficient of $4.5 \times 10^{-6}/°C$.

The thus obtained graphite material is worked into a given shape in the same manner as in Example 1, and then the thermally decomposed carbon film is formed thereon in the same manner as in Example 1 to obtain a temperature keeping cylindrical body 30 as shown in FIG. 3.

COMPARATIVE EXAMPLE 3

A carbonaceous material is prepared by kneading 70 parts by weight of pulverized aggregate coke having an average particle size of 20 μm and 30 parts by weight of coal tar pitch as a binder under heating and then pulverizing the kneaded mass to 100–300 μm.

A graphite material is prepared by shaping the above carbonaceous material into a desired form through rubber press method and firing and graphitizing the shaped body. The resulting graphite substrate has an average pore size of more than 75000 angstrom as measured by mercury penetration method, an aspect ratio in thermal expansion coefficient of 1.15 and an average thermal expansion coefficient of $3.5 \times 10^{-6}/°C$.

The thus obtained graphite material is worked into a given shape in the same manner as in Example 1, and then the thermally decomposed carbon film is formed thereon in the same manner as in Example 1 to obtain a temperature keeping cylindrical body 30 as shown in FIG. 3.

COMPARATIVE EXAMPLE 4

The same procedure as in Example 1 is repeated by using the same graphite material as in Comparative Example 2 to form a temperature keeping cylindrical body 30 as shown in FIG. 4.

COMPARATIVE EXAMPLE 5

The same procedure as in Example 1 is repeated by using the same graphite material as in Comparative Example 3 to form a temperature keeping cylindrical body 30 as shown in FIG. 4.

COMPARATIVE EXAMPLE 6

The same C/C composite as in Example 5 is worked into a temperature keeping graphite cylindrical body without the formation of the thermally decomposed carbon film.

COMPARATIVE EXAMPLE 7

The same C/C composite as in Example 6 is worked into a temperature keeping graphite cylindrical body without the formation of the thermally decomposed carbon film.

After each of the above temperature keeping cylindrical bodies in Examples 1–6 and Comparative Examples 1–7 is applied to the silicon single crystal pulling apparatus shown in FIG. 2, a durable test is made to obtain results as shown in Table 1.

TABLE 1

| | Durable life (hours) | Life and state |
|---|---|---|
| Example 1 | 3560 | occurrence of cracks due to adhesion between temperature keeping cylindrical body and support base |
| Example 2 | 4230 | occurrence of cracks due to adhesion between temperature keeping cylindrical body and support base |
| Example 3 | 3750 | adhesion of Si between temperature keeping cylindrical body and support base |
| Example 4 | 4180 | adhesion of Si between temperature keeping cylindrical body and support base |
| Example 5 | 4830 | occurrence of cracks due to penetration of Si into the inside lower region |
| Example 6 | 5760 | occurrence of cracks due to penetration of Si into the inside lower region |
| Comparative Example 1 | 1320 | occurrence of cracks due to the formation of silicon carbide on the inside upper region |
| Comparative Example 2 | 2150 | occurrence of cracks due to adhesion between temperature keeping cylindrical body and support base |
| Comparative Example 3 | 2210 | occurrence of cracks due to Si absorption by the inside lower region |
| Comparative Example 4 | 1250 | occurrence of cracks and peeling in the thermally decomposed carbon film |
| Comparative Example 5 | 1450 | occurrence of cracks and peeling in the thermally decomposed carbon film |
| Comparative Example 6 | 1240 | occurrence of cracks due to the formation of silicon carbide on the inside upper region |
| Comparative Example 7 | 1350 | occurrence of crystal defect due to falling down of carbon fiber based on the formation of silicon carbide on the inside upper region |

EXAMPLE 7

A felt of carbon fibers is wound around a mold corresponding to a shape of a quartz crucible part several times and impregnated with a phenol resin and cured and graphitized in an inert gas atmosphere. By repeating such resin impregnation and graphitization several times is obtained a bowl-shaped body of C/C composite, which is mechanically worked to a diameter of 400 mm.

The same procedure as in Example 1 is repeated by using the C/C composite bowl-shaped body to form a crucible protection part 26 provided with a thermally decomposed carbon film 74 as shown in FIG. 6.

EXAMPLE 8

The same bowl-shaped body of C/C composite as in Example 7 is prepared by impregnating a woven carbon fiber cloth with a phenol resin, curing, firing at 900° C. and then repeating these procedures two times.

The same procedure as in Example 1 is repeated by using such a C/C composite bowl-shaped body to form a crucible protection part 26 provided with a thermally decomposed carbon film 74 as shown in FIG. 6.

COMPARATIVE EXAMPLE 8

The same C/C composite bowl-shaped body as in Example 7 is worked into a crucible protection part without the formation of the thermally decomposed carbon film.

COMPARATIVE EXAMPLE 9

The same C/C composite bowl-shaped body as in Example 8 is worked into a crucible protection part without the formation of the thermally decomposed carbon film.

After each of the above crucible protection parts in Examples 7–8 and Comparative Examples 8–9 is applied to the silicon single crystal pulling apparatus shown in FIG. 2, a durable test is made to obtain results as shown in Table 2.

TABLE 2

| | Durable life (hours) | Life end state |
|---|---|---|
| Example 7 | 3260 | consumed due to reduction of thickness in the inside lower region |
| Example 8 | 3850 | occurrence of cracks due to the penetration of Si into the outside lower region |
| Comparative Example 8 | 960 | occurrence of cracks due to the formation of silicon carbide on the inside upper region |
| Comparative Example 9 | 1250 | occurrence of crystal defect due to falling down of carbon fiber based on the formation of silicon carbide on the inside upper region |

As mentioned above, according to the invention, the temperature keeping cylindrical body and/or the crucible protection part are made from the carbonaceous material such as graphite substrate and C/C composite and covered on at least an inside upper region thereof with the thermally decomposed carbon film, so that not only the formation of silicon carbide due to the reaction between the carbonaceous material and SiO gas but also the deposition of Si vapor on the carbonaceous material can be prevented and hence the durability of the temperature keeping cylindrical body and/or the crucible protection part can be improved to prolong the service life of the silicon single crystal pulling apparatus.

What is claimed is:

1. An apparatus for pulling a silicon single crystal comprising a main apparatus body, a crucible disposed therein and comprised of a quartz crucible part and a crucible protection part, a heating member disposed at an outside of the crucible therearound, a temperature keeping cylindrical body disposed at an outside of the heating member, and a heat insulating material disposed between the temperature keeping cylindrical body and the main apparatus body, characterized in that at least an inside upper region of at least one of the temperature keeping cylindrical body and the crucible protection part made from a carbonaceous material is covered with a thermally decomposed carbon film and wherein the carbonaceous material is a carbon-bonded carbon fiber composite.

2. An apparatus according to claim 1, wherein the thermally decomposed carbon film is extended on an outside upper region and the full inside region of at least one of the temperature keeping cylindrical body and the crucible protection part at a thickness of 10–100 micrometers.

3. An apparatus for pulling a silicon single crystal comprising a main apparatus body, a crucible disposed therein and comprised of a quartz crucible part and a crucible protection part, a heating member disposed at an outside of the crucible therearound, a temperature keeping cylindrical body disposed at an outside of the heating member, and a heat insulating material disposed between the temperature keeping cylindrical body and the main apparatus body, characterized in that at least an inside upper region of at least one of the temperature keeping cylindrical body and the crucible protection part made from a carbonaceous material is covered with a thermally decomposed carbon film and wherein the carbonaceous material is a graphite substrate having an average thermal expansion coefficient of 3.5 to $6.0 \times 10^{-6}/°$ C. within a range of from room temperature to 1000° C. and an average pore size of not less than 10000 angstrom within a pore size range of 75 to 75000 angstrom as measured by mercury penetration method.

4. An apparatus according to claim 2, wherein the thermally decomposed carbon film is extended on an outside upper region and the full inside region of at least one of the temperature keeping cylindrical body and the crucible protection part at a thickness of 10–100 $\mu$m.

5. An apparatus according to claim 3, wherein the carbonaceous material is a carbon-bonded carbon fiber composite.

* * * * *